United States Patent
Kay et al.

(10) Patent No.: US 6,582,875 B1
(45) Date of Patent: Jun. 24, 2003

(54) USING A MULTICHANNEL LINEAR LASER LIGHT BEAM IN MAKING OLED DEVICES BY THERMAL TRANSFER

(75) Inventors: David B. Kay, Rochester, NY (US); Lee W. Tutt, Webster, NY (US); Mark D. Bedzyk, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/055,579

(22) Filed: Jan. 23, 2002

(51) Int. Cl.[7] .............. G03F 7/34; G03F 7/20; B41J 2/45; B41J 2/47
(52) U.S. Cl. ............ 430/200; 430/201; 430/321; 430/396; 430/397; 347/238; 347/239
(58) Field of Search ................. 430/200, 201; 347/238, 239

(56) References Cited

U.S. PATENT DOCUMENTS

| | | | |
|---|---|---|---|
| 4,804,975 A | * 2/1989 | Yip | 346/76 L |
| 5,521,748 A | * 5/1996 | Sarraf | 347/239 |
| 5,578,416 A | 11/1996 | Tutt | |
| 5,688,551 A | 11/1997 | Littman et al. | 430/200 |
| 5,851,709 A | 12/1998 | Grande et al. | |
| 5,937,272 A | 8/1999 | Tang | 430/200 |
| 6,114,088 A | 9/2000 | Wolk et al. | 430/200 |
| 6,140,099 A | 10/2000 | Wolk et al. | 430/200 |
| 6,169,565 B1 | 1/2001 | Ramanujan et al. | 347/239 |
| 6,211,997 B1 | 4/2001 | Nutt et al. | 347/239 |
| 6,214,520 B1 | 4/2001 | Wolk et al. | 430/200 |
| 6,221,553 B1 | 4/2001 | Wolk et al. | 430/200 |

\* cited by examiner

Primary Examiner—Richard L. Schilling

(57) ABSTRACT

A method of making an OLED device comprises the steps of: providing a donor element having transferable organic material in transfer relationship with an OLED substrate; forming a substantially uniform linear laser light beam; providing a spatial light modulator responsive to the linear laser light beam and adapted to form multichannel linear laser light beams; individually modulating selected channels to form one or more laser light beam segments wherein each segment can include one or more laser light beam channels and further wherein the laser light beam segment(s) have substantially square intensity profiles in a first direction and a substantially Gaussian intensity profile in a second direction perpendicular to the first direction and are directed onto the donor element; and the donor element producing heat in response to the light from the modulated segments so as to heat transfer organic material onto selected areas of the substrate.

24 Claims, 13 Drawing Sheets

USING A MULTICHANNEL LINEAR LASER LIGHT BEAM IN MAKING OLED DEVICES BY THERMAL TRANSFER

CROSS REFERENCE TO RELATED APPLICATION

Reference is made to commonly-assigned U.S. patent application Ser. No. 10/021,410 filed Dec. 12, 2001, entitled "Apparatus for Permitting Transfer of Organic Material From a Donor to Form a Layer in an OLED Device" by Phillips et al, the disclosure of which is incorporated herein by reference.

FIELD OF THE INVENTION

The present invention relates to depositing organic material onto substrates for use in making organic light emitting diode (OLED) devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic organic EL device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the light-emitting layer of the organic EL medium. Other organic layers present in the organic EL medium can provide electronic transport functions primarily, such as the hole-transporting layer or the electron-transporting layer. In forming the RGB pixels in a full-color organic EL display panel, it is necessary to devise a method to precisely pattern the light-emitting layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow-mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision for accurately forming EL devices.

A method for patterning high-resolution organic EL displays has been disclosed in commonly-assigned U.S. Pat. No. 5,851,709 by Fleming et al. This method is comprised of the following sequences of steps: 1) providing a donor substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Fleming et al. approach is that patterning of an array of openings on the donor substrate is required. This creates many of the same problems as the shadow-mask method, including the requirement for precision mechanical alignment between the donor substrate and the display substrate. A further problem is that the donor pattern is fixed and cannot be changed readily.

Using an unpatented donor sheet and a precision light source, such as a laser, can remove some of the difficulties seen with a patterned donor. Such a method is disclosed by Littman in commonly-assigned U.S. Pat. No. 5,688,55 1, and in a series of patents by Wolk et al. (U.S. Pat. Nos. 6,114,088; 6,140,009; 6,214,520; and 6,221,553). The latter patents teach a method that can transfer, by a change in adhesion, the light-emitting layer of an EL device from a donor sheet to a substrate by heating selected portions of the donor with laser light. While this is a useful technique, there are serious difficulties in applying it on a large-scale manufacturing of EL devices. To make an EL device that includes thousands—or even millions—of pixels in three colors in a reasonable amount of time (a few minutes) would require a laser beam which moves very fast in two dimensions. This increases alignment problems, and also increases the possibility of causing misalignment due to vibrations from the rapidly moving machinery. A further disadvantage is that the rapid movement of the laser beam necessitates a very short dwell time on each spot to be transferred, which further necessitates a very high-powered laser.

SUMMARY OF THE INVENTION

It has been determined that the combination of short dwell time and high power can cause non-uniform spattering of the donor material and reciprocity problems, and does not allow the uniform transfer of material that would be afforded with an evaporation or sublimation process. Such a process further contributes to non-uniform transfer of donor material through uneven heating of the donor material because of the rotationally-symmetric Gaussian distribution of the laser; that is, the center of the laser has greater intensity and thus can cause the transfer of more material than the edges of the laser beam.

It is therefore an object of the present invention to provide a method of forming layers on an EL device by donor transfer in a rapid manner while eliminating problems due to short laser dwell time on the donor.

This object is achieved by a method of depositing organic layers onto a substrate in the making of an OLED device, comprising the steps of:

(a) providing a donor element having transferable organic material in transfer relationship with an OLED substrate;

(b) forming a substantially uniform linear laser light beam;

(c) providing a spatial light modulator responsive to the linear laser light beam and adapted to form multichannel linear laser light beams;

(d) individually modulating selected channels to form one or more laser light beam segments wherein each segment can include one or more laser light beam channels and further wherein the laser light beam segment(s) have substantially square intensity profiles in a first direction and a substantially Gaussian intensity profile in a second direction perpendicular to the first direction and are directed onto the donor element; and (e) the donor element producing heat in response to the light from the modulated segments so as to heat transfer organic material onto selected areas of the substrate.

An advantage of this method is that electroluminescent panels can be produced rapidly with high quality. The overall donor transfer time is reduced while not reducing dwell time, and therefore keeping the material transfer in the evaporation or sublimation regime, and spattering is greatly reduced or eliminated in the donor material transfer. A further advantage of this method is that the substantially uniform (i.e. non-Gaussian) intensity profile of laser light beam segments in one direction maintains greater uniformity of the deposited layer across the pixel width. A further advantage is that the need for a shadow mask and all the problems inherent in its use are eliminated. A further advantage of this method is that it can maintain EL spot precision on large EL panels, which is difficult or impossible to do with existing methods. A further advantage is that the method is quickly and easily scalable to any size EL panels and/or different pixel sizes without the need to wait for a different-size shadow mask to be fabricated. A further advantage is that this method can be used to print very small emitting pixels (5 to 10 micrometers), which are difficult or impossible to make with a shadow mask technique.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. Color OLED devices typically emit light of two or more colors. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which most other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is sometimes used in multicolor display panels and is employed to designate any portion of a pixel that can be independently addressable to emit a specific color. For example, a blue subpixel is that portion of a pixel that can be addressed to emit blue light. In a full-color display, a pixel generally comprises three primary-color subpixels, namely blue, green, and red. In this specification, the term "pixel" will be used interchangeably with "subpixel." The term "pitch" is used to designate the distance separating two pixels or subpixels in a display panel. Thus, a subpixel pitch means the separation between two subpixels.

Figure 1:
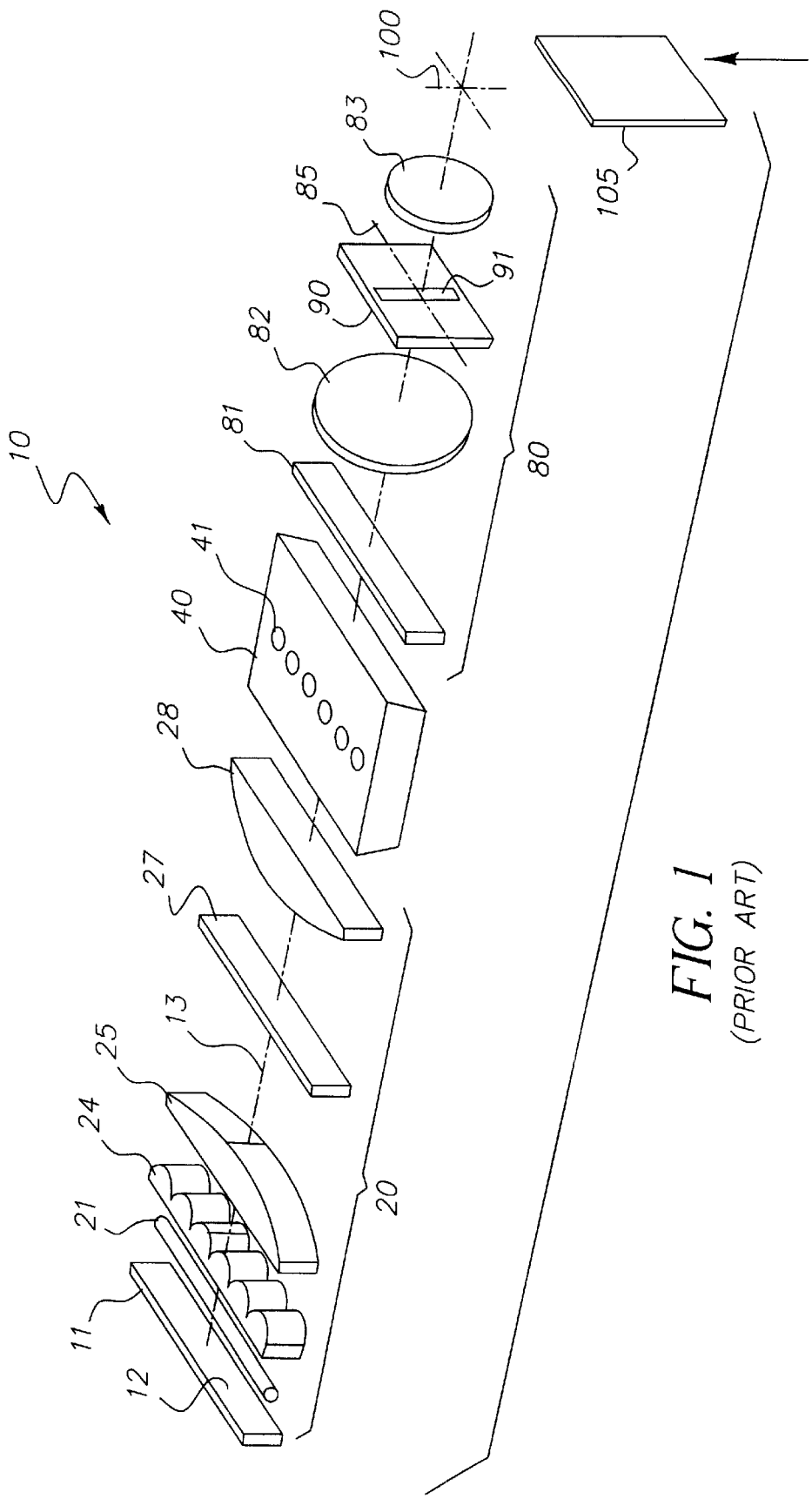
FIG. 1 is an exploded view of a laser printhead (prior art) suitable for use in this invention.

Turning now to FIG. 1, there is shown an exploded view of a laser printhead 10 suitable for use in this invention. Such a laser printhead has been described by Ramanujan and Kurtz in commonly-assigned U.S. Pat. No. 6,169,565, the contents of which are incorporated by reference. Laser printhead 10 includes a laser source, which is laser diode array 11, illumination optics 20, spatial light modulator 40 (which in this embodiment is a total internal reflection modulator or TIR modulator array) which includes a multiplicity of modulator pixels 41, and print lens 80. The characteristics which make laser printhead 10 suitable for the invention herein are 1) illumination optics 20 converts laser light 13 to a substantially uniform linear light beam; and 2) spatial light modulator 40 forms the uniform linear light beam into a multichannel linear laser light beam, that is a beam including two or more channels which can be used to form light segments whose nature will be further elaborated. An example of a spatial light modulator is described by Nutt et al in commonly-assigned U.S. Pat. No. 6,211,997, the contents of which are incorporated by reference. It includes a plurality of independently addressable pixels, such that each pixel is an independent phase grating allowing individual control of each channel in the multichannel linear laser light beam, and therefore allowing a pattern of irradiation to be effected in the area of interest.

Laser printhead 10 is shown in a configuration where the laser source is laser diode array 11, which includes multiple laser-diode multi-mode emitters 12. Illumination optics 20 optically combines the light from laser diode array 11 into a substantially uniform linear laser light beam. As described by Ramanujan and Kurtz, this is a preferred configuration because the multiple laser emitters, mapped by illumination optics 20 to cover the full width of the uniform linear light beam, provides source redundancy and thereby reduces the sensitivity of the system to the malfunction of any individual laser-diode multimode emitter 12. However, for the purposes of the invention herein, an alternate configuration of laser printhead 10 can include a single laser emitter (not shown) as the laser light source.

Laser printhead 10 also can include, for example, fiber lens 21, laser lenslet array 24, combiner field lens 25, cross array lens 27, field lens 28, electrodes 43, print lens elements 81, 82, 83, and spatial filter 90 which can include slit 91 at Fourier plane 85. The laser array is imaged at image plane 100, which can have donor 105. All of these elements are described by Ramanujan and Kurtz.

Figure 2A:
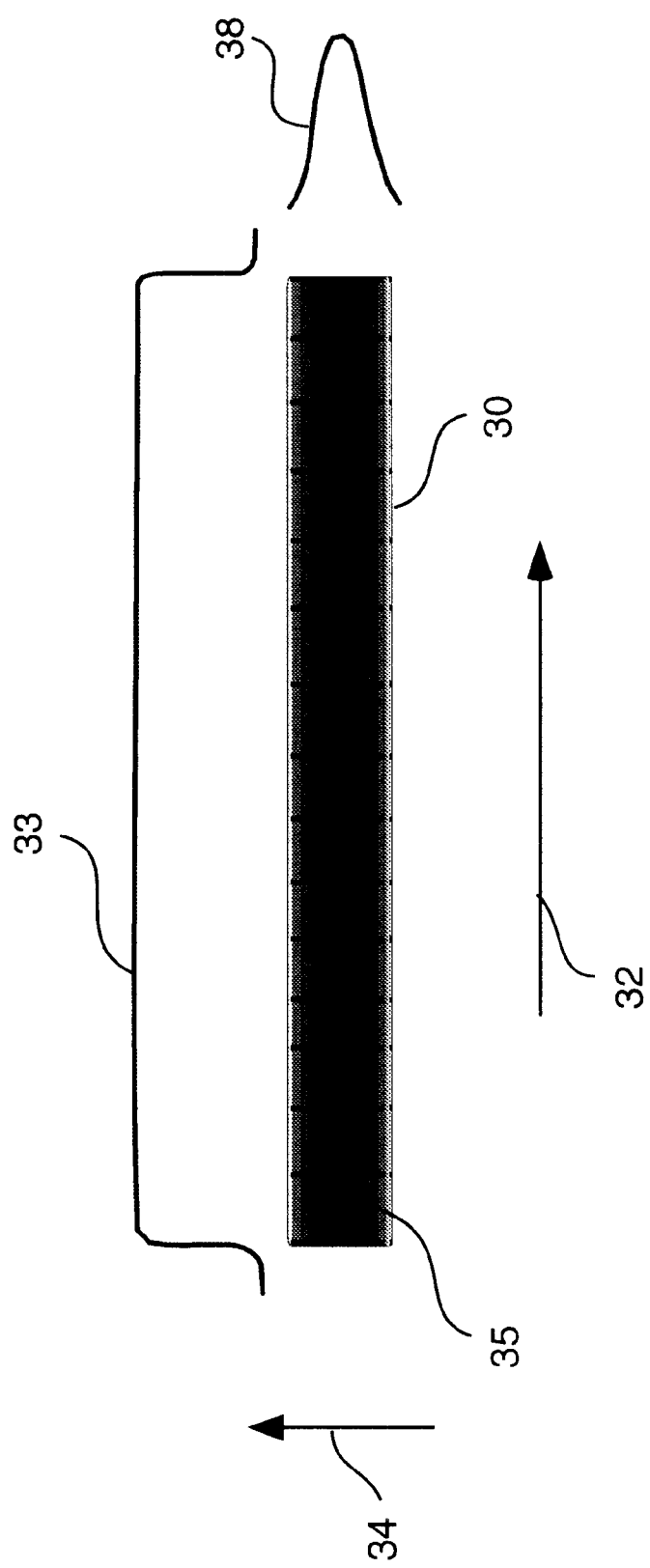
FIG. 2a is a cross-sectional view of a uniform linear laser light beam and its intensity profile in two dimensions.

FIG. 2a shows a cross-sectional view of a uniform linear laser light beam 30, as produced by laser printhead 10 but unmodulated by spatial light modulator 40. Uniform linear laser light beam 30 is substantially uniform, by this we mean that the intensity of uniform linear laser light beam 30 with respect to distance in a first direction 32 (represented by light intensity profile 33) does not vary by more than ±50% and more preferably ±10%. The intensity of uniform linear light beam 30 with respect to distance in a second direction 34 perpendicular to first direction 32 varies in a substantially Gaussian manner, that is, the light intensity is distributed in a manner that closely resembles a statistically normal distribution as represented by light intensity profile 38. FIG. 2a also shows the multichannel nature of linear laser light beam 30, meaning that uniform linear laser light beam 30 includes two or more open channels 35 which can be individually modulated by modulator pixels 41 and is therefore also known as a multichannel linear laser light beam.

Figure 2B:
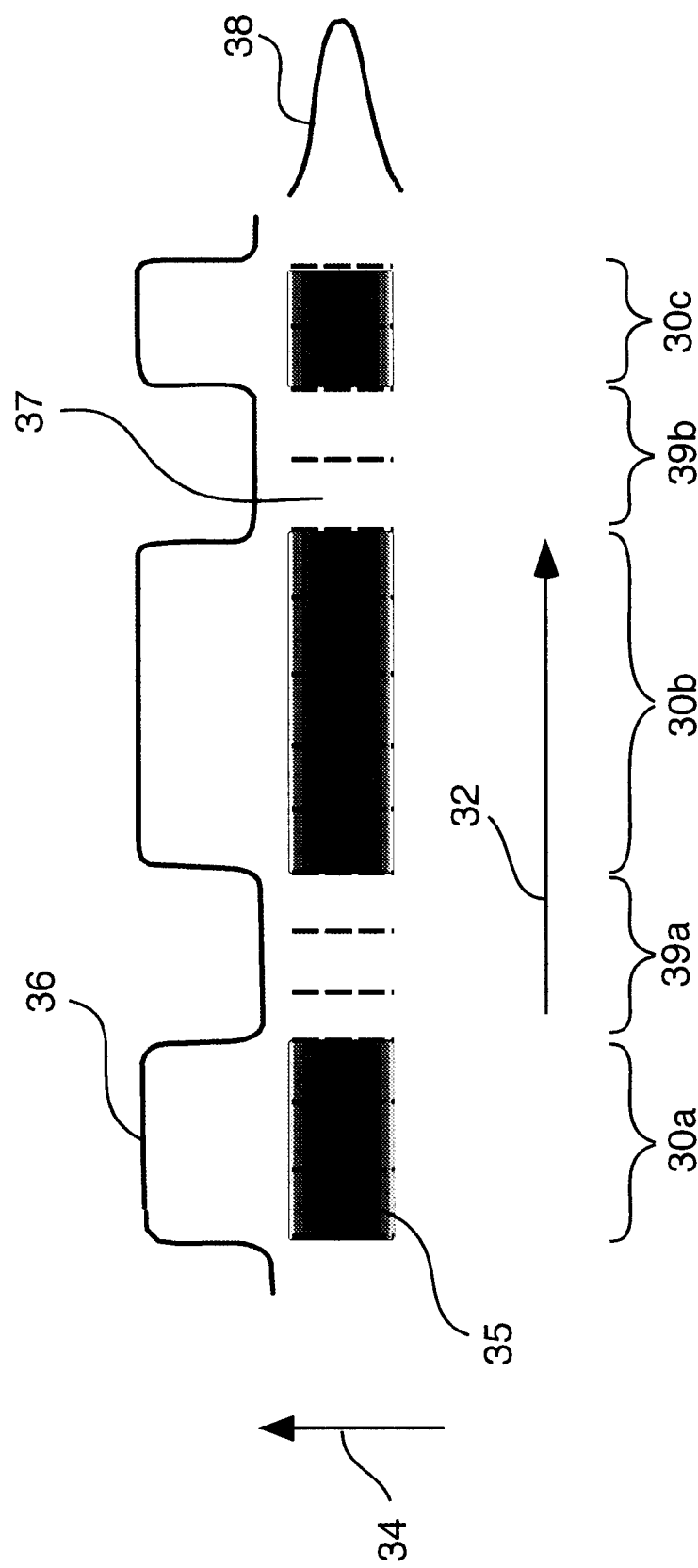
FIG. 2b is a cross-sectional view of a uniform linear laser light beam that has been spatially modulated or segmented and its intensity profile in two dimensions.

FIG. 2b shows a cross-sectional view of a uniform linear laser light beam 30 that has been modulated or segmented into one or more segments of light by spatial light modulator 40 of laser printhead 10. This is shown schematically as uniform linear light beam segments 30a, 30b, and 30c, separated by gaps 39a and 39b. Each linear light beam segment includes one or more channels of light, wherein each laser light beam channel is derived from an individual modulator pixel 41 in spatial light modulator 40. The channels that allow light to pass are shown as open channels 35. The gaps 39a and 39b between light segments include one or more closed channels 37. Closed channels 37 represent modulator pixels 41 that have been modulated to prevent the passage of laser light, while open channels 35 have been modulated to allow the passage of laser light.

The result of such modulation is that linear laser light beam 30 has a substantially square intensity distribution in first direction 32, as represented by light intensity profile 36. Substantially square means the top of the distribution is substantially uniform and the sidewalls are perpendicular, although one skilled in the art will realize that the sidewalls can slope downwardly and outwardly, forming a trapezoidal-like structure. Linear laser light beam 30 maintains a Gaussian distribution in second direction 34, as represented by light intensity profile 38.

Figure 3:
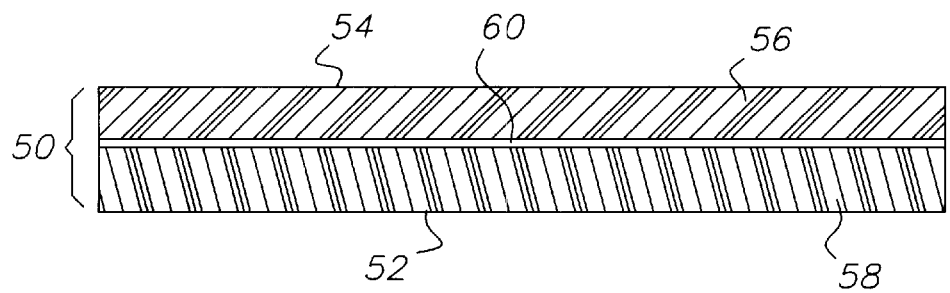
FIG. 3 is a cross-sectional view of a donor element suitable for use in this invention.

FIG. 3 shows an embodiment of the structure of a suitable donor element 50 for use in this invention. Donor support element 58 is uniformly coated with radiation-absorbing material 60 capable of absorbing radiation in a predetermined portion of the spectrum to produce heat, then coated with organic material 56. Organic material 56 is a transferable organic material, that is, it can be transferred from donor element 50 to a substrate when heated by radiation-absorbing material 60. Donor support element 58 then includes non-transfer surface 52 and organic material 56 includes transfer surface 54.

Donor support element 58 can be made of any of several materials which meet at least the following requirements: The donor support must be sufficiently flexible and possess adequate tensile strength to tolerate precoating steps and roll-to-roll or stacked-sheet transport of the support in the practice of the invention. The donor support must be capable of maintaining the structural integrity during the light-to-heat-induced transfer step while pressurized on one side, and during any preheating steps contemplated to remove volatile constituents such as water vapor. Additionally, the donor support must be capable of receiving on one surface a relatively thin coating of organic donor material, and of retaining this coating without degradation during anticipated storage periods of the coated support. Support materials meeting these requirements include, for example, metal foils, certain plastic foils, and fiber-reinforced plastic foils. While selection of suitable support materials can rely on known engineering approaches, it will be appreciated that certain aspects of a selected support material merit further consideration when configured as a donor support useful in the practice of the invention. For example, the support can require a multi-step cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

Radiation-absorbing material 60 is capable of absorbing radiation in a predetermined portion of the spectrum and producing heat. Radiation-absorbing material 60 can be a dye such as the dyes specified in commonly-assigned U.S. Pat. No. 5,578,416, a pigment such as carbon, or a metal such as nickel, titanium, etc.

A typical OLED device can contain the following layers, usually in this sequence: an anode, a hole-injecting layer, a hole-transporting layer, a light-emitting layer, an electron-transporting layer, a cathode. Any or all of these can include organic material 56, thus forming an organic layer. Organic material 56 can be a hole-injecting material, a hole-transporting material, an electron-transporting material, a light-emitting material, a host material, or a combination of any of these materials. These materials are described below.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injecting materials reportedly useful in organic EL devices are described in EP 0 891 121 A1 and EP 1,029,909 A1.

Hole-Transporting (HT) Material

Hole-transporting materials useful as organic material 56 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or including at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. Such compounds include those represented by structural formula (A).

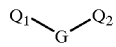

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

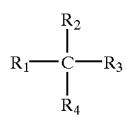

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

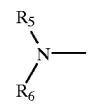

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

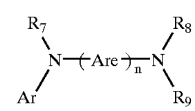

D wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a trialkylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole), and
N,N'-di-1-naphthalenyl-N,N'-diphenyl-4,4'-diaminobiphenyl.
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]p-phenyl
4,4'-Bis[N-(3-acenaphthenyl)-N-phenylamino]biphenyl 1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthaenyl)-N-phenylamino]biphenyl
4,4'-Bis[N-(2-perylenyl)-N-phenylamino]biphenyl
4,4'-Bis[N-(-1coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in commonly-assigned EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Material

Light-emitting materials useful as organic material 56 are well known. As more fully described in commonly-assigned U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly-assigned U.S. Pat. Nos. 4,769,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

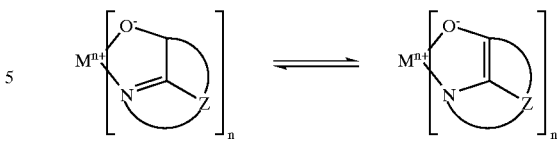

E wherein

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

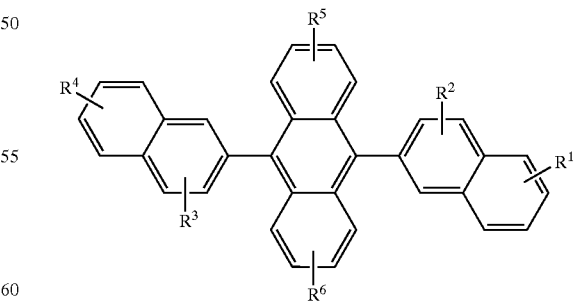

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

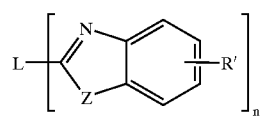

G

Where:

n is an integer of 3 to 8;

Z is O, NR or S; and

R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2,2', 2''-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

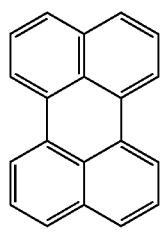

L1

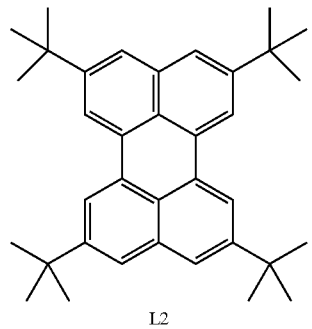

L2

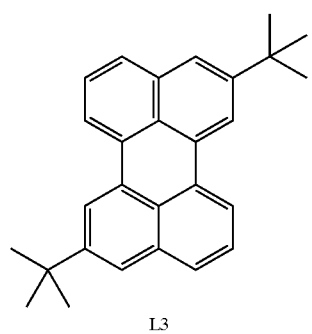

L3

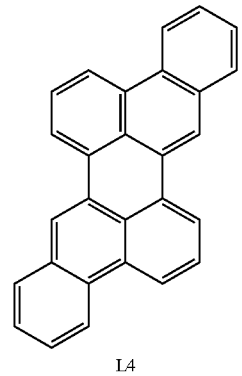

L4

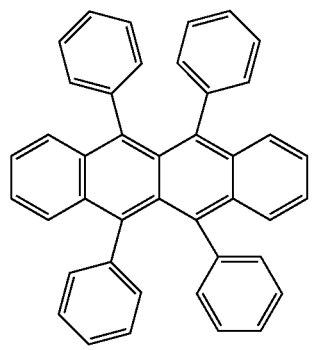

L5

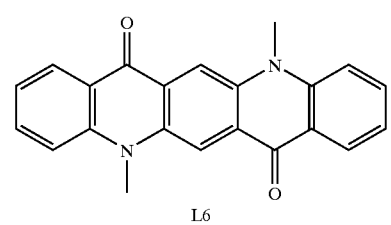

L6

-continued

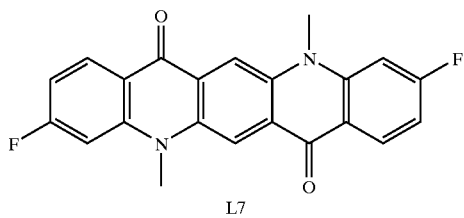

L7

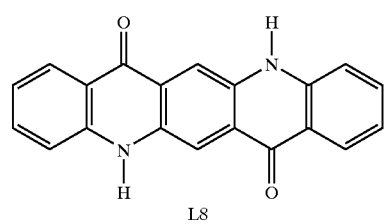

L8

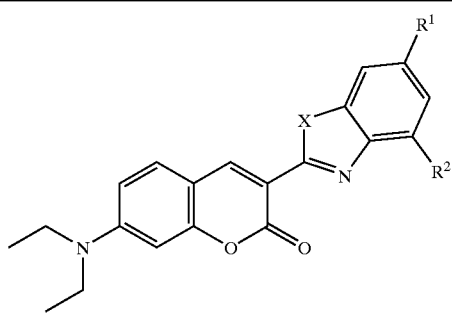

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

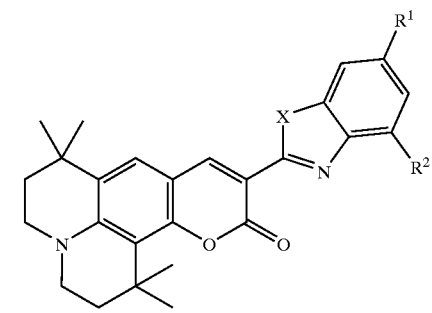

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |

-continued

| | | | |
|---|---|---|---|
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

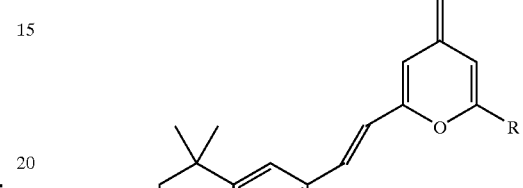

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

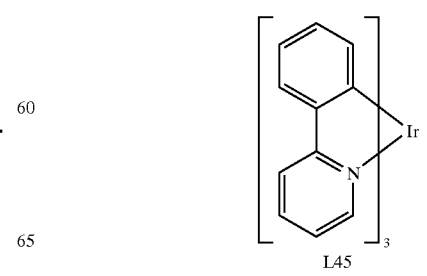

L45

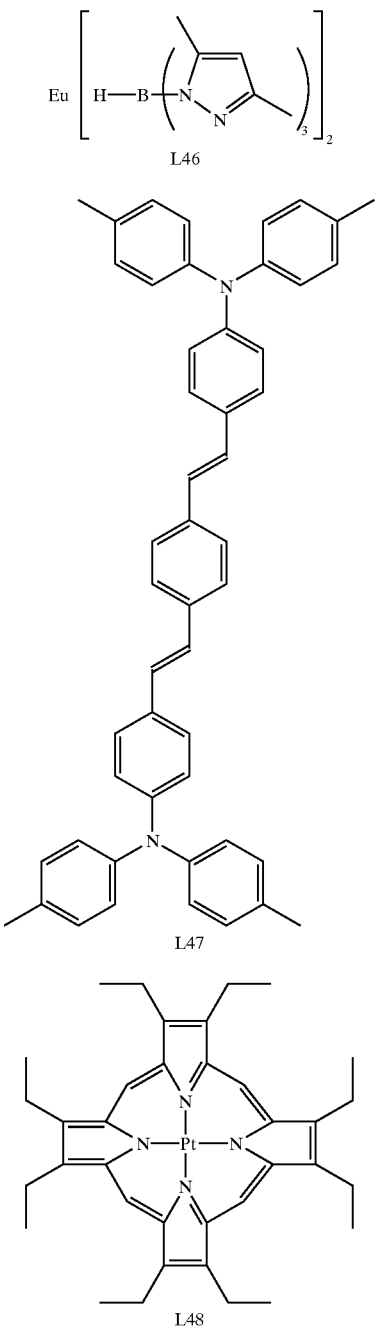

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al in commonly-assigned U.S. Pat. No. 6,194,119 B1 and references therein.

Electron-Transporting (ET) Material

Preferred electron transporting materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in commonly-assigned U.S. Pat. No. 4,356,429 and various heterocyclic optical brighteners as described in commonly-assigned U.S. Pat. No. 4,539,507. Benzazoles satisfying structural formula (G) are also useful electron transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers,* Vols. 1–4, H. S. Nalwa, ed., John Wiley and Sons, Chichester (1997).

In some instances, a single layer can serve the function of supporting both light emission and electron transportation, and will therefore include emissive material and electron transport material.

Note that this invention can be used to transfer any of the above materials in sequential steps or can be used to transfer and form multiple layers at once. Not all organic layers of the OLED device need be deposited by this invention. This invention is most advantageous when some or all of the materials needed to form the light-emitting layer are transferred by this invention. It will be appreciated that other layers can be deposited by conventional methods, for example by unpatterned vapor deposition. Wet coating techniques such as spin coating or curtain coating can also be used, but it is preferable to employ these methods prior to material transfer by this invention.

Figure 4A:
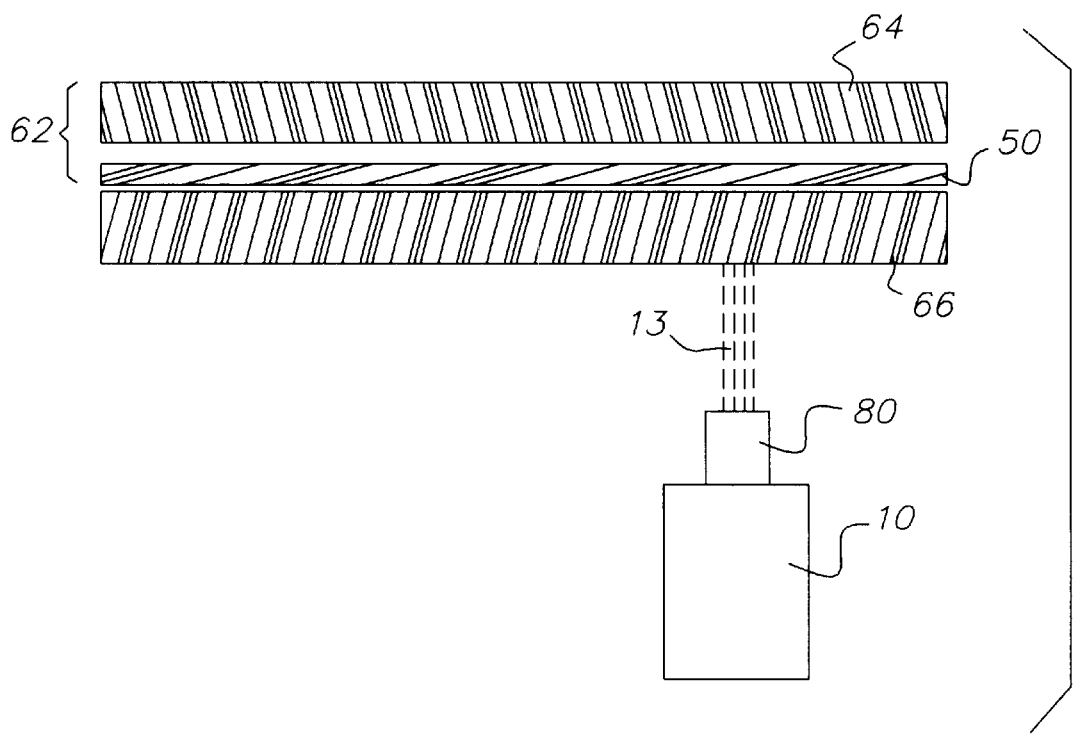
FIG. 4a is a cross-sectional view of the printer irradiating a secured substrate/donor element combination with a modulated multichannel linear laser light beam in accordance with this invention.

FIG. 4a shows a cross-sectional view of laser printhead 10 irradiating a secured substrate/donor element combination with a modulated multichannel linear laser light beam in accordance with this invention. Micropositioning position equipment is not shown for clarity. Donor element 50 is placed in a transfer relationship with substrate 64, that is, donor element 50 is placed in contact with substrate 64 (not shown), or is held with a controlled separation from substrate 64. Donor element 50 is held in position by pressurizing means 66. Pressurizing means 66 can be a transparent support or can be a chamber that is pressurized with gas to secure donor element 50 in a close relationship with substrate 64, as taught by Phillips, et al in above-cited commonly-assigned U.S. patent application Ser. No. 10/021,410.

Substrate 64 can be an organic solid, an inorganic solid, or a combination of organic and inorganic solids that provides a surface for receiving the light-emitting material from a donor. Substrate 64 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 64 can be a homogeneous mixture of materials, a composite of materials, or multiple layers of materials. Substrate 64 can be an OLED substrate, that is a substrate commonly used for preparing OLED devices, e.g. active-matrix low-temperature polysilicon TFT substrate. The substrate 64 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials.

Laser printhead 10 emits multichannel laser light 13, that is to say multiple modulated channels of the linear laser light beam, through print lens 80. Multichannel laser light 13 is drawn for clarity of illustration as a series of lines to emphasize its nature as a plurality of individually addressable channels of laser light. It will be understood that these channels can be contiguous and behave on irradiation as a continuous band of laser light. Multichannel laser light 13 is directed onto donor element 50 through pressurizing means 66, which is transparent, and strikes the non-transfer surface of donor element 50. A desired pattern can be obtained by modulating the channels of multichannel laser light 13 while providing relative motion between laser printhead 10 and secured substrate/donor element 62.

Figure 4B:
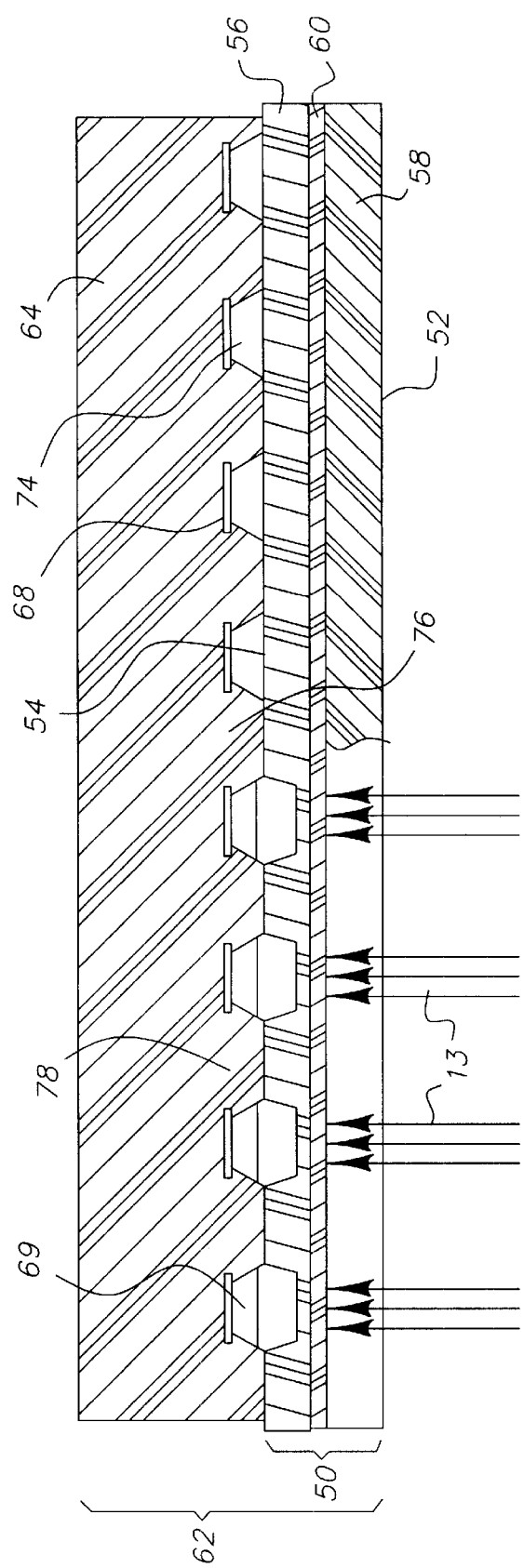
FIG. 4b is a cross-sectional view in greater detail of irradiating a secured substrate/donor element combination with a modulated multichannel linear laser light beam in accordance with this invention.

FIG. 4b shows a cross-sectional view in greater detail the process of depositing organic material to a substrate by irradiating a secured substrate/donor element combination with a modulated multichannel linear laser light beam in accordance with this invention. In this embodiment, substrate 64 includes an array of thin-film transistors (TFT) 68. Receiving surface 76 of substrate 64 is uneven due to the presence of thin-film transistors 68, which are separated in substrate 64 by raised surface portions 78 as a result of the multilayer construction of each pixel or subpixel. This is described by Tang in commonly-assigned U.S. Pat. No. 5,937,272, the contents of which are incorporated by reference. The presence of raised surface portions 78 maintains the separation of gap 74 against the pressure (not shown) that is exerted against non-transfer surface 52.

Donor element 50 has been prepared with radiation-absorbing material 60 and organic material 56 coated on donor support element 58. Radiation-absorbing material can be a dye such as the dyes specified in commonly-assigned U.S. Pat. No. 5,578,416, a pigment such as carbon, or a metal such as nickel, titanium, etc. Multichannel laser light 13 includes separate modulated segments, each comprised of one or more channels of light from laser printhead 10, as shown in FIG. 2b. Multichannel laser light 13 irradiates non-transfer surface 52 and produces heat in donor element 50 when it strikes radiation-absorbing material 60. This heats organic material 56 in the immediate vicinity of multichannel laser light 13. A large portion of the light impinging on donor element 50 can be converted to heat, but this will only happen at selectively irradiated portions of donor element 50. Some or all of the heated portion of organic material 56 is heat-transferred (e.g. it can be sublimed, vaporized, or ablated) and is deposited on substrate 64 where it becomes deposited organic material 69 on receiving surface 76 of substrate 64 in a pattern transfer.

It will be clear to those skilled in the art that this process can be adapted to prepare a color OLED device by repeating this process with different donor elements 50 corresponding to each different color subpixel to be prepared, e.g. red, green, and blue. For example, a first donor element 50 is placed in a close relationship to substrate 64, and is then irradiated with segments of laser light 13 at the positions of the subpixels for one color, e.g. blue. A second and third donor element 50 are placed in a sequential relationship with substrate 64 and the process of irradiation with segments of laser light 13 is repeated at the positions of the subpixels for the additional colors, e.g. green and red. The result is a substrate 64 in which different portions correspond to different color pixels or subpixels.

Figure 5:
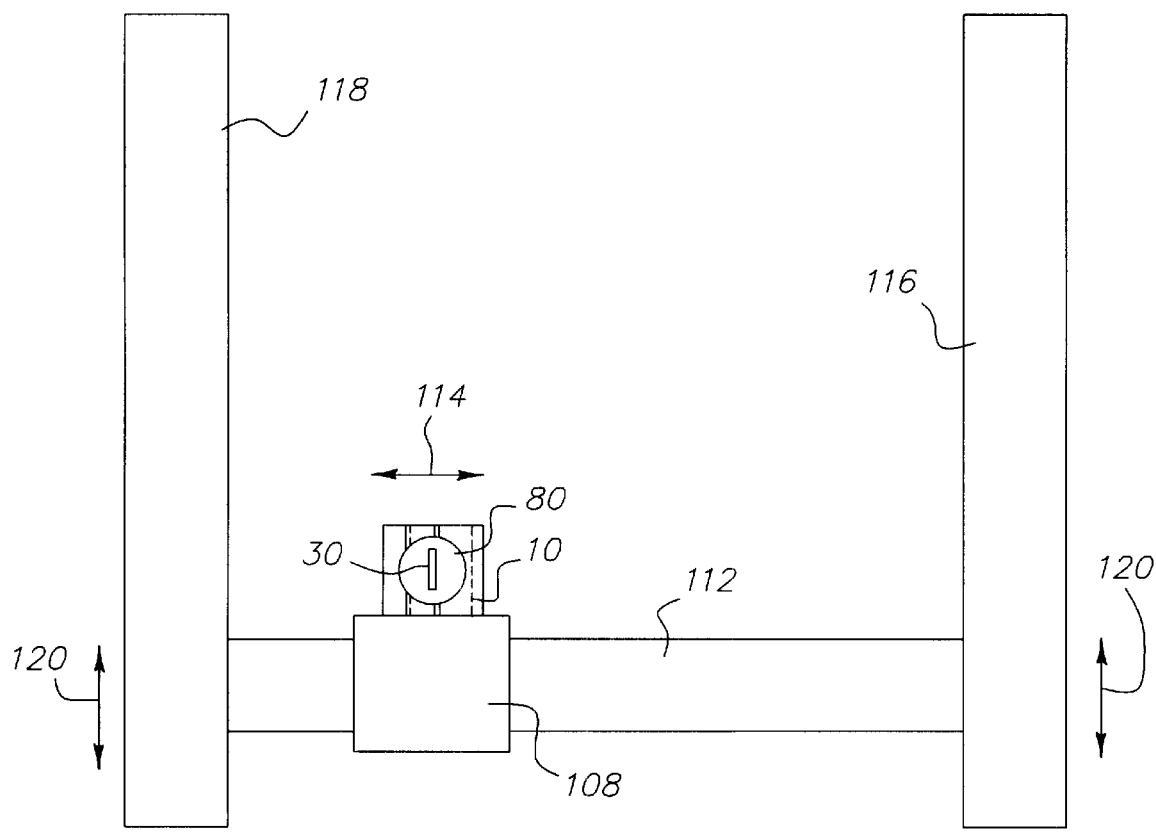
FIG. 5 is a top view diagram showing a first embodiment of an apparatus of a laser printhead and micropositioning devices in accordance with this invention.

Turning now to FIG. 5, there is shown a first embodiment of an apparatus of laser printhead 10 as described above and micropositioning devices in accordance with this invention. This apparatus serves to provide relative movement between laser printhead 10 and the donor element by moving laser printhead 10 while the substrate/donor element combination is held stationary. Laser printhead 10 is mounted on micropositioning device 112. In this example, carriage 108 represents the movable portion of micropositioning device 112. Micropositioning device 112 is capable of moving and locating laser printhead 10 in x-direction 114 with a resolution on the order of micrometers. X-direction 114 is perpendicular or substantially perpendicular—that is, within an acceptable tolerance to true perpendicularity—to the orientation of uniform linear light beam within the plane defined by x direction 114 and y direction 120. For example, in some situations that tolerance may be $4 \times 10^{-4}$ radians, but that depends on the particular arrangement used. Micropositioning device 112 is commercially available from manufacturers such as Anorad Corporation and Dover Instruments.

Micropositioning device 112 is mounted to micropositioning device 116 and micropositioning device 118. The latter two are similar to micropositioning device 112, but are arranged in a manner orthogonal to micropositioning device 112, and are thus capable of moving the combination of micropositioning device 112 and laser printhead 10 in y-direction 120 and of providing a small angular alignment of the x-y axes.

Figure 6:
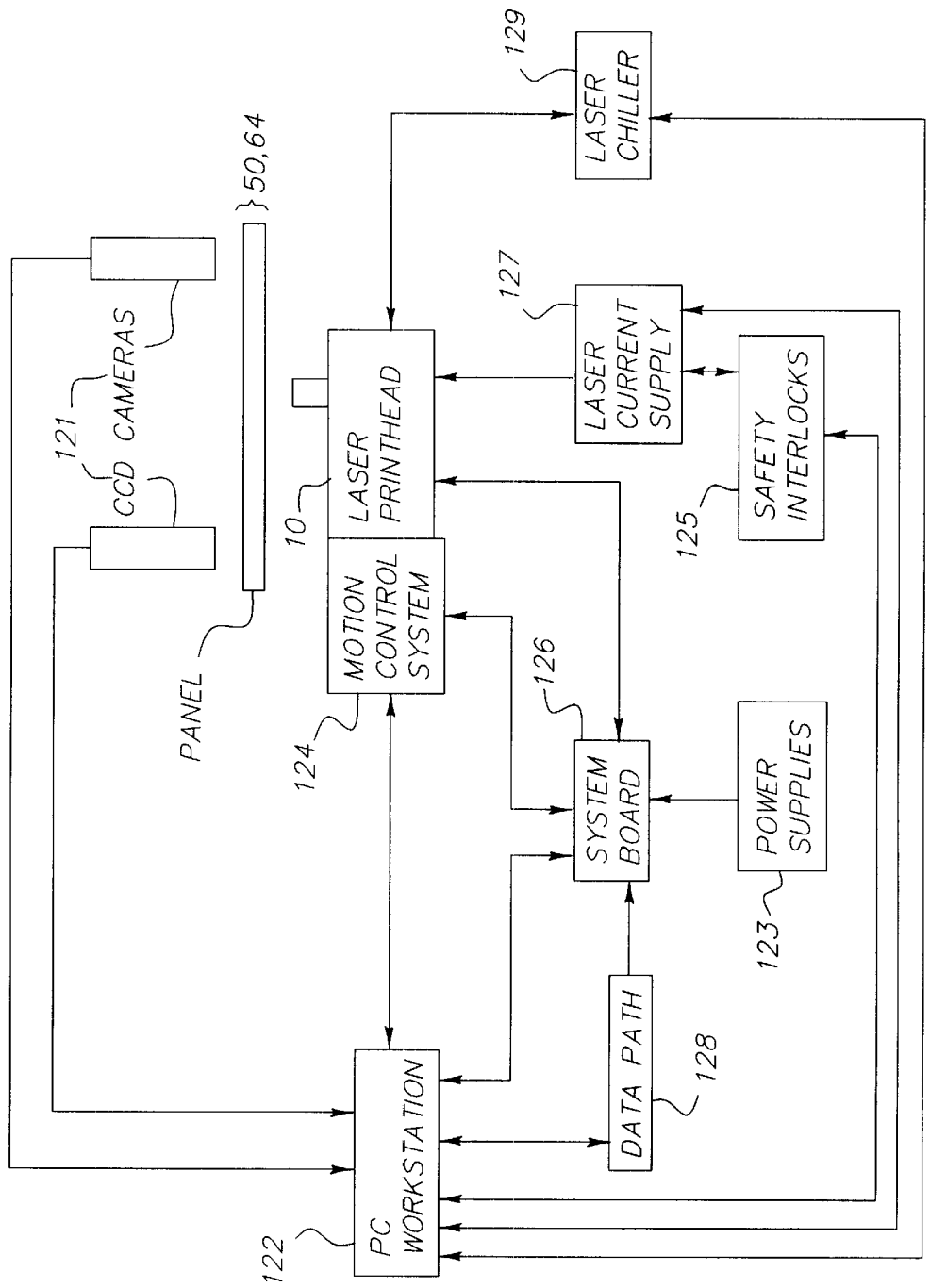
FIG. 6 is a block diagram of the apparatus control logic.

FIG. 6 shows a block diagram of the logic of one embodiment of a system to control the apparatus described in FIG. 5. Motion control system 124, which includes micropositioning device 112, micropositioning device 116, and micropositioning device 118, controls the position and movement of laser printhead 10 and is in turn controlled by PC workstation 122 which includes the file with pattern 70 to be printed. Laser printhead 10 writes to donor element 50 and substrate 64, here shown as a single object for clarity of illustration. Writing is herein defined as irradiating the non-transfer surface 52 of donor element 50 so as to heat portions of donor element 50 and cause the transfer of organic material 56 from the transfer surface 54 of donor element 50 to substrate 64. This will become further apparent in the description that follows.

As it moves, laser printhead 10 writes to selected portions of donor element 50 and substrate 64. The portions to be written to are determined by the structure of substrate 64, e.g. if substrate 64 includes an array of thin-film transistors (TFT) 68, it will be desirable to write at the positions of the TFT anodes, but to refrain from writing elsewhere. A data image, shown as pattern 70 in FIG. 8, of substrate 64 is stored on PC workstation 122. As motion control system 124 moves laser printhead 10, this data image is passed via data path 128 to system board 126. System board 126 controls the spatial light modulator of laser printhead 10, and uses the image data to modulate the spatial light modulator 40 such that laser printhead 10 writes only to the desired positions of donor element 50 and substrate 64. This process modulates the uniform linear laser light beam 13 such that a series of light segments is formed, each segment comprising one or more light channels, as shown in FIG. 2b. Substrate 64 must be prealigned or located in x, y, z dimensional space to the laser printhead motion control system. Thereafter, the laser printhead is precisely aligned to substrate 64. A pair of charge-coupled device (CCD) cameras 121 with measurement capability is shown for this purpose. Power supplies 123 supply the power to the system board and can be integral to the system board or separate entities. Laser current supply 127 supplies power to the laser in laser printhead 10. Laser chiller 129 cools the laser source in laser printhead 10. Safety Interlocks 125 represent well-known protection for users of laser equipment.

Figure 7A:
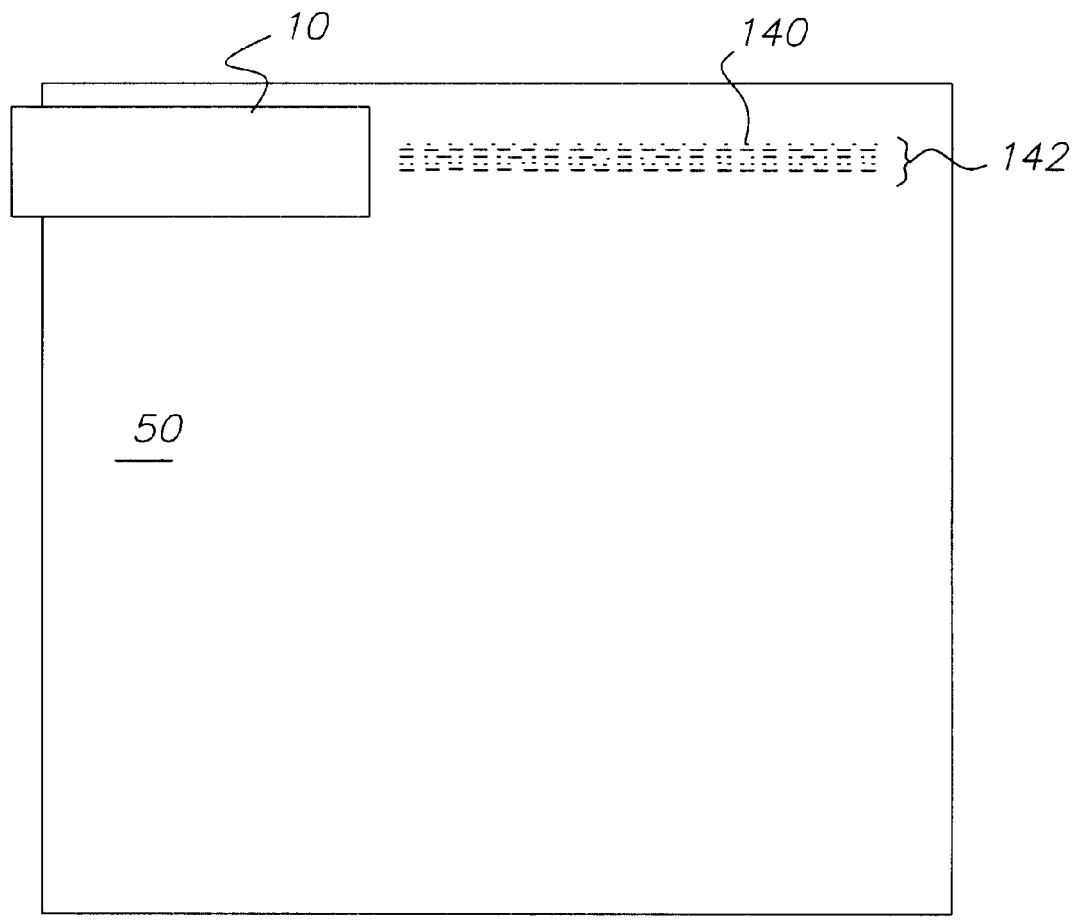
FIG. 7a is a top view of the laser printhead irradiating the donor element in a pattern.

Turning now to FIG. 7a, there is shown a top view of laser printhead 10 irradiating the donor element 50 in a pattern. Relative movement is provided between laser printhead 10 and donor element 50. Spatial light modulator 40 allows the individual laser beam channels to be turned on and off independently. This allows the creation of a first predetermined linear path 142 or swath of laser pattern 140 on the non-transfer surface of donor element 50. Linear path 142 includes a series of predetermined first positions where it is desirable to irradiate donor 50 so as to cause the deposition of organic material at these positions. Laser pattern 140 is created so as to write at the positions of the TFT anodes, but to refrain from writing elsewhere.

Figure 7B:
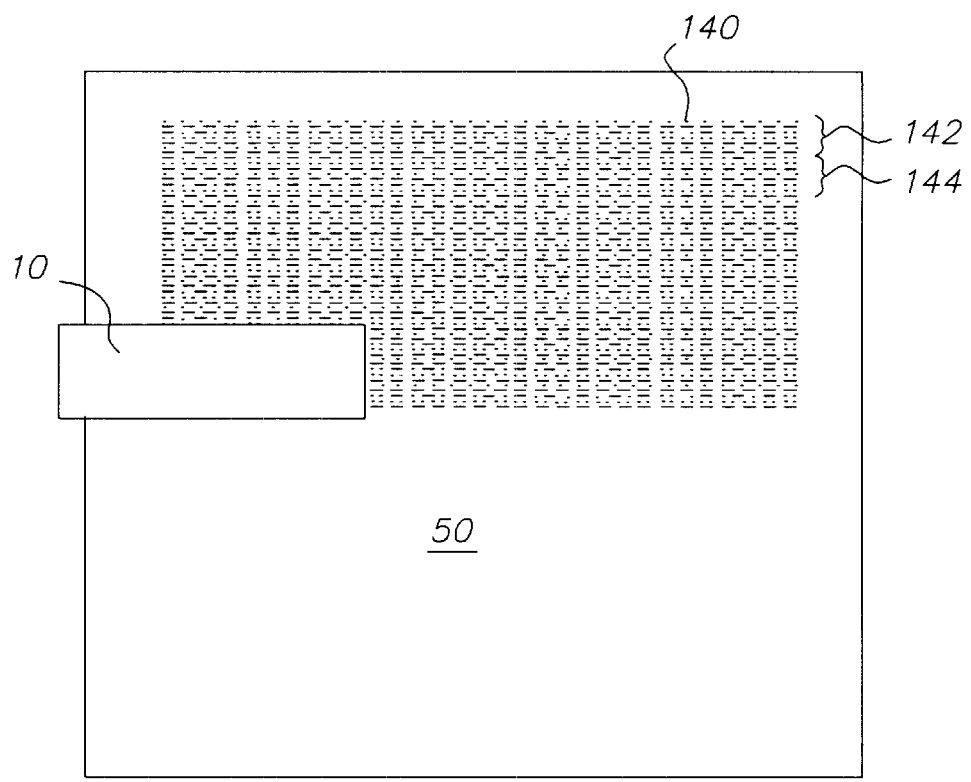
FIG. 7b is a top view of the laser printhead irradiating the donor element in a pattern.

FIG. 7b shows a top view of laser printhead 10 irradiating donor element 50 in a pattern. FIG. 7b is the same as FIG. 7a, except that laser printhead has made several consecutive predetermined linear paths across donor element 50, and thus laser pattern 140 now includes of a plurality of such paths, including first linear path 142, second linear path 144, and subsequent linear paths. Each linear path comprises a series of predetermined positions, that is second positions, third positions, etc., where it is desirable to irradiate donor 50 so as to cause the deposition of organic material at these positions.

Figure 8:
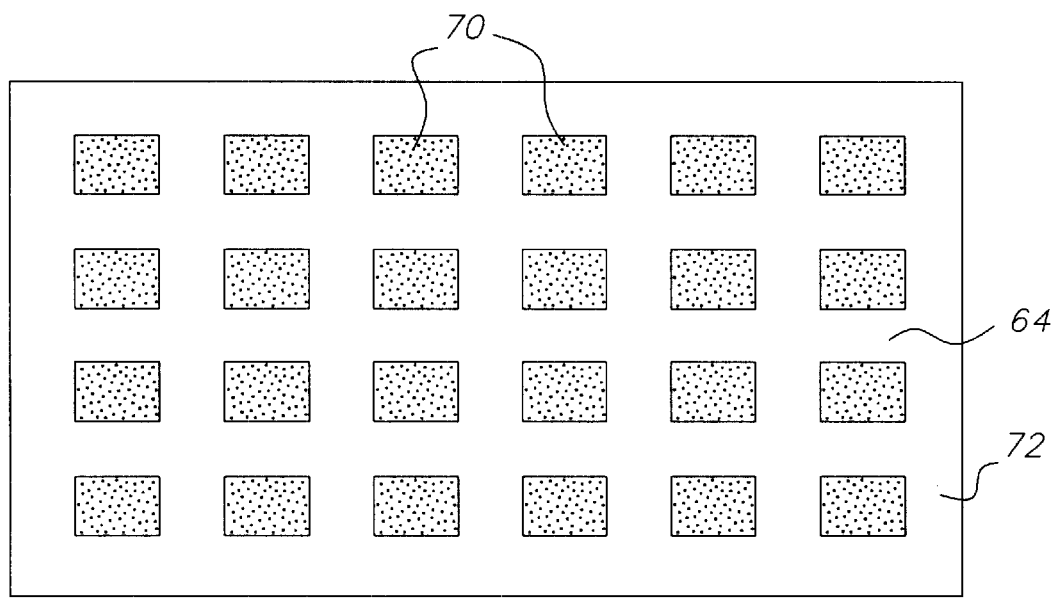
FIG. 8 is a plan view of a patterned substrate that has been prepared in accordance with this invention.

FIG. 8 shows a plan view of treated substrate 72, which has been treated in the manner described in this invention. Predetermined portions of organic material 56 have been transferred to substrate 64 in transferred pattern 70. Transferred pattern 70 has been formed in a manner consistent with the end-use of treated substrate 72 (e.g. transferred pattern 70 is of an OLED light-emitting material that has been transferred to the positions of existing thin-film transistor anodes on substrate 64).

Figure 9:
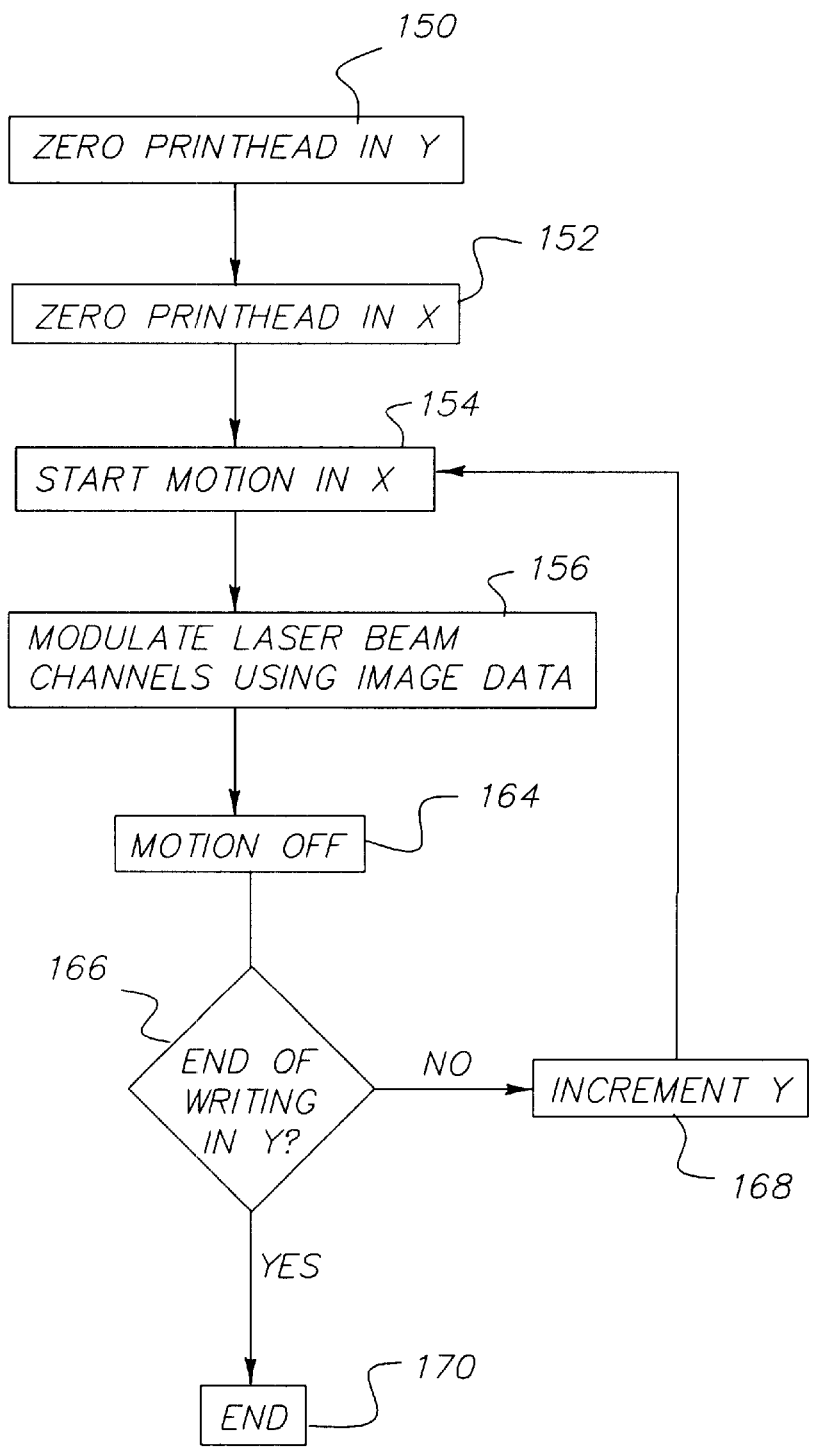
FIG. 9 is a block diagram showing the steps in accordance with this invention.

FIG. 9 shows the steps in accordance with this invention. Laser printhead 10 is zeroed in the y direction (step 150), then zeroed in the x direction (step 152) based on CCD camera information about the position of the receiver so that laser printhead 10 starts scanning from a first position which can be a corner of substrate 64. The alignment can be dynamic, or the image data can be modified, or the substrate position can be modified, or a combination of these techniques can be used. Laser printhead 10 is put into motion in the x direction (step 154), and traverses the width of the substrate 64. During this traverse, the channels of the linear laser light beam are modulated as necessary (step 156) using image data previously prepared and stored in a computer file to create pixels of transferred donor material. This process creates one predetermined linear path or swath of laser pattern 140. When the end of the area to be written on substrate 64 (e.g. the end of the pixels or sub-pixels on an OLED device) is reached in the x direction, printer motion is stopped (step 164). If the printer is at the end of the area to be written on substrate 64 in the y direction (step 166), the process is stopped (step 170). If the printer is not yet at the end of the substrate in the y direction (step 166), the relative position between linear laser light beam 13 and the secured substrate/donor element 62 is changed, that is, laser printhead 10 is incremented in the y direction by the width of one swath (step 168) and steps 154 to 164 are repeated.

Figure 10:
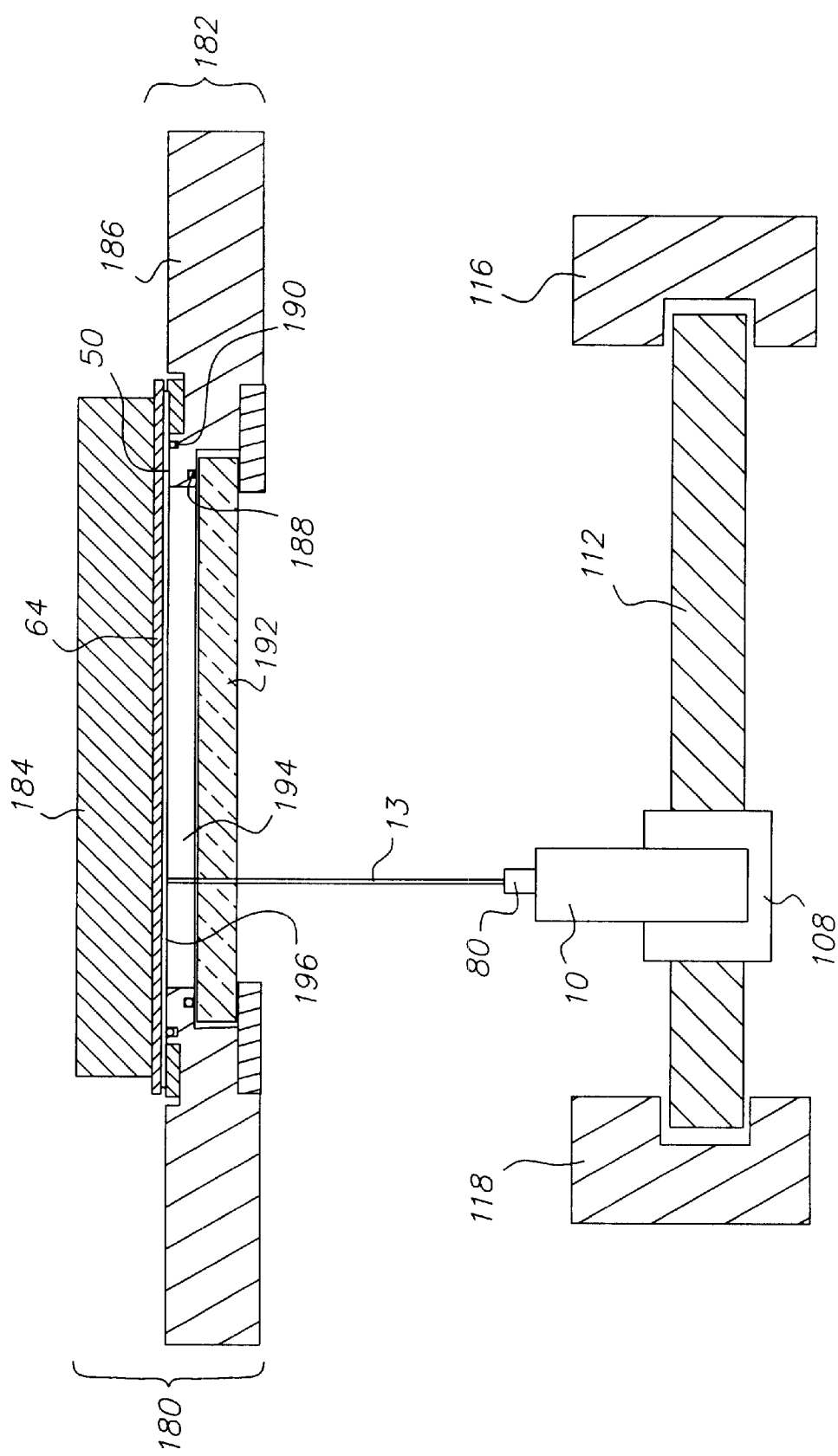
FIG. 10 is a cross-sectional view showing the use of this invention with an apparatus for holding the donor element and substrate together in a secured substrate/donor element combination during the transfer of organic material from a donor to form a layer in an OLED device.

FIG. 10 shows a cross-sectional view of the use of this invention with an apparatus for securing the donor element and substrate together in a secured substrate/donor element combination and holding it stationary during the transfer of organic material from a donor to form a layer in an OLED device. Apparatus 180 has been described by Phillips et al above-cited commonly-assigned U.S. patent application Ser. No. 10/021,410 and can function at atmospheric pressure or in a reduced pressure environment provided by a vacuum chamber (not shown). It includes first fixture 182 and second fixture 184, which support donor element 50 and substrate 64 in a relationship such that there is either a gap between donor element 50 and substrate 64 or donor element 50 and substrate 64 are in contact. The presence of gaskets 188 and 190 in base plate 186 encapsulates donor element 50 and substrate 64 and forms chamber 194, which is pressurized to maintain the desired degree of contact between donor element 50 and substrate 64. Transparent portion 192 allows multichannel laser light 13 from laser printhead 10 to pass through and irradiate non-transfer surface 196 of donor element 50. Relative movement of laser printhead 10 and apparatus 180, which holds the secured substrate/donor element combination, facilitates the transfer of organic material from donor element 50 to substrate 64 in a predetermined linear path. The movement of laser printhead 10 by micropositioning device 112, and the subsequent movement of micropositioning devices 116 and 118, allows multichannel laser light 13 (whose elements are modulated as needed using image data) to illuminate donor element 50 in a laser light pattern, and therefore effect the OLED deposition, that is, transfer organic material 56 from donor element 50 to substrate 64 in the desired transferred pattern 70 under the ambient conditions, e.g. under vacuum or at atmospheric pressure.

Figure 11A:
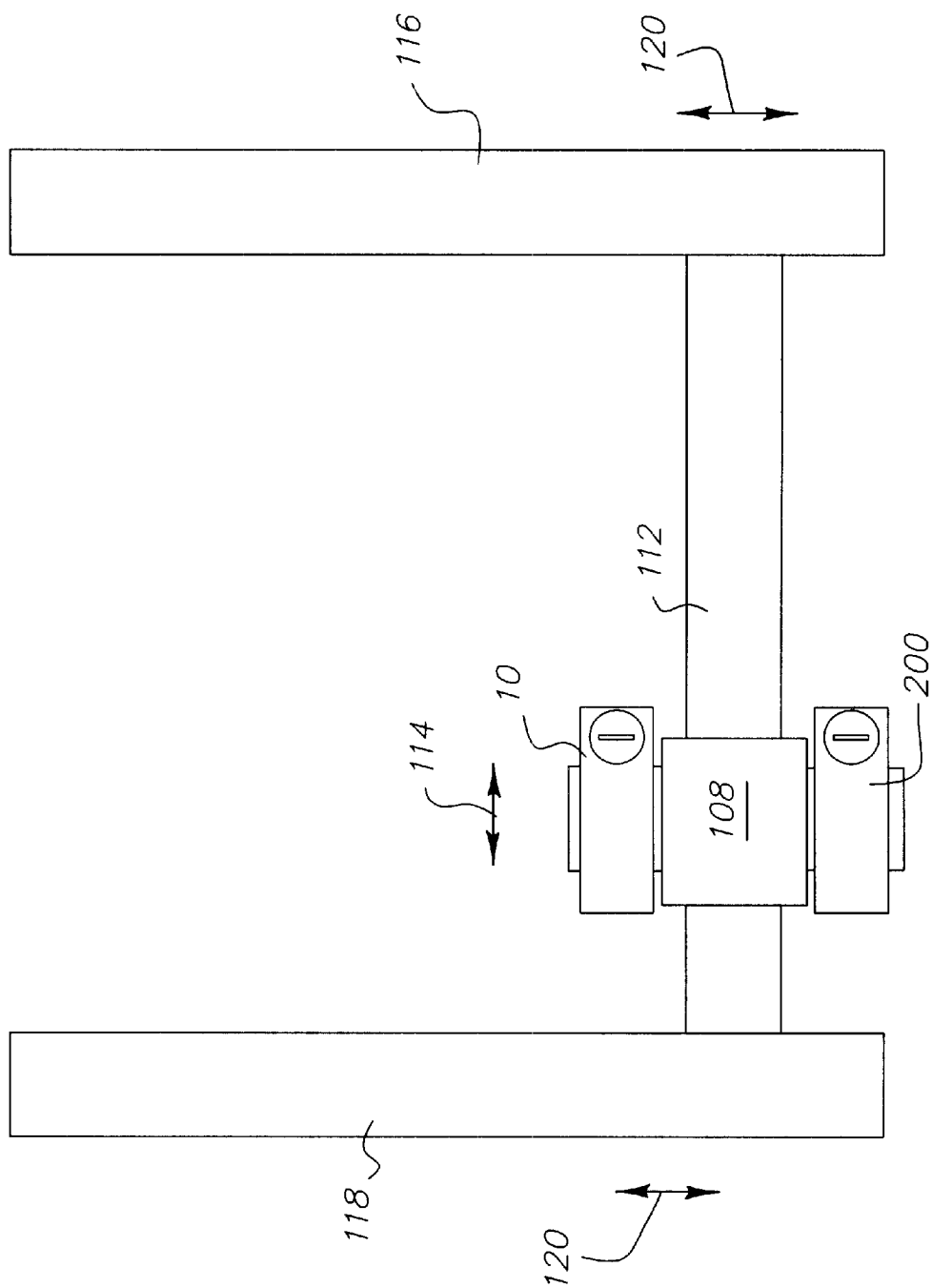
FIG. 11a is a cross-sectional diagram showing another embodiment of an apparatus of multiple laser printheads and micropositioning devices in accordance with this invention.

FIG. 11a is a cross-sectional diagram showing another embodiment of an apparatus of multiple laser printheads and micropositioning devices in accordance with this invention. This apparatus incorporates at least laser printhead 10 and a second similar laser printhead 200. Laser printheads 10 and 200 are mounted on micropositioning device 112. Micropositioning device 112 is capable of moving and locating laser printheads 10 and 200 in x-direction 114 with a resolution on the order of micrometers. Micropositioning device 112 is mounted to micropositioning device 116 and micropositioning device 118. The latter two are similar to micropositioning device 112, but are arranged in a manner orthogonal to micropositioning device 112, and are thus capable of moving the combination of micropositioning device 112 and laser printheads 10 and 200 in y-direction 120. This allows the creation of multiple predetermined linear paths or swaths of laser irradiation simultaneously.

Figure 11B:
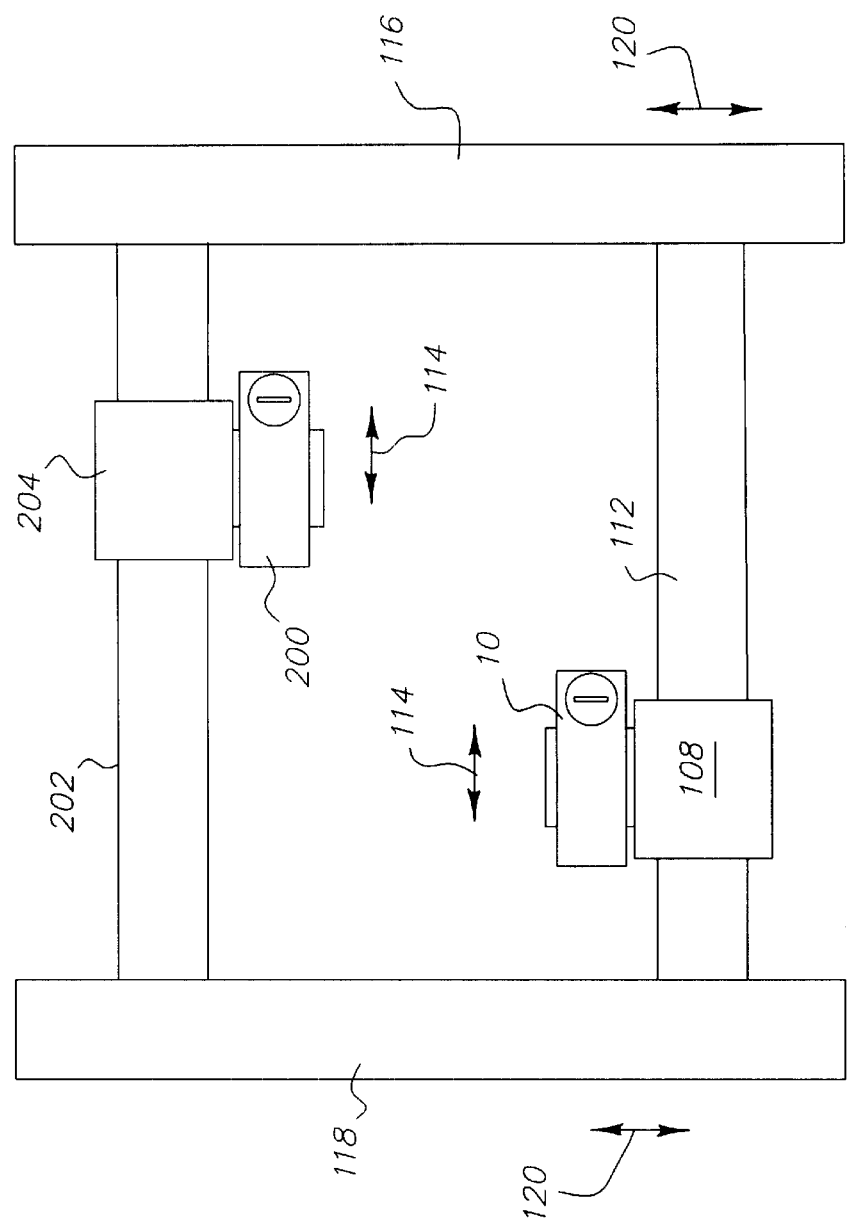
FIG. 11b is a cross-sectional diagram showing another embodiment of an apparatus of multiple laser printheads and micropositioning devices in accordance with this invention.

FIG. 11b is a cross-sectional diagram showing another embodiment of an apparatus of multiple laser printheads and micropositioning devices in accordance with this invention. This apparatus incorporates at least laser printhead 10 mounted on micropositioning device 112 and similar laser printhead 200 mounted on micropositioning device 202. In this example, carriages 108 and 204 represent the movable portions of micropositioning devices 112 and 202, respectively. Micropositioning device 112 is capable of moving and locating laser printhead 10 in x-direction 114 with a resolution on the order of micrometers. Micropositioning device 202 is capable of moving and locating laser printhead 200 in x-direction 114 with a resolution on the order of micrometers. Micropositioning device 112 and micropositioning device 202 are mounted to micropositioning device 116 and micropositioning device 118. The latter two are similar to micropositioning devices 112 and 202, but are arranged in a manner orthogonal to micropositioning devices 112 and 202. They are thus capable of moving the combination of micropositioning device 112 and laser printhead 10, and the combination of micropositioning device 202 and laser printhead 200, in y-direction 120. This allows the creation of multiple predetermined linear paths or swaths of laser irradiation simultaneously.

The invention has been described in detail with particular reference to certain preferred embodiments thereof, but it will be understood that variations and modifications can be effected within the spirit and scope of the invention.

PARTS LIST

| | |
|---|---|
| 10 | laser printhead |
| 11 | laser diode array |
| 12 | laser diode multimode emitter |
| 13 | laser light |
| 20 | illumination optics |
| 21 | fiber lens |
| 24 | laser lenslet array |
| 25 | combiner field lens |
| 27 | cross array lens |
| 28 | field lens |
| 30 | uniform linear laser light beam |
| 30a | uniform linear laser light beam segment |
| 30b | uniform linear laser light beam segment |
| 30c | uniform linear laser light beam segment |
| 32 | first direction |
| 33 | light intensity profile |
| 34 | second direction |
| 35 | open channel |
| 36 | light intensity profile |
| 37 | closed channel |
| 38 | light intensity profile |
| 39 | gap |
| 39a | gap |
| 39b | gap |
| 40 | spatial light modulator |
| 41 | modulator pixels |
| 43 | electrode |
| 50 | donor element |
| 52 | non-transfer surface |
| 54 | transfer surface |
| 56 | organic material |
| 58 | donor support element |
| 60 | radiation-absorbing material |
| 62 | secured substrate/donor element |
| 64 | substrate |
| 66 | pressurizing means |
| 68 | thin-film transistor |
| 69 | deposited organic material |
| 70 | pattern |
| 72 | treated substrate |
| 74 | gap |
| 76 | receiving surface |
| 78 | raised surface portion |
| 80 | print lens |
| 81 | print lens element |
| 82 | print lens element |
| 83 | print lens element |
| 85 | Fourier plane |
| 90 | spatial filter |
| 91 | slit |
| 100 | image plane |
| 105 | donor |
| 108 | carriage |
| 112 | micropositioning device |
| 114 | direction |
| 116 | micropositioning device |
| 118 | micropositioning device |
| 120 | direction |
| 121 | CCD cameras |
| 122 | PC workstation |
| 123 | power supply |
| 124 | motion control system |
| 125 | safety interlock |
| 126 | system board |
| 127 | laser current supply |

-continued

PARTS LIST

| | |
|---|---|
| 128 | data path |
| 129 | laser chiller |
| 140 | laser pattern |
| 142 | linear path |
| 144 | linear path |
| 150 | block |
| 152 | block |
| 154 | block |
| 156 | block |
| 164 | block |
| 166 | decision block |
| 168 | block |
| 170 | block |
| 180 | apparatus |
| 182 | first fixture |
| 184 | second fixture |
| 186 | base plate |
| 188 | gasket |
| 190 | gasket |
| 192 | transparent portion |
| 194 | chamber |
| 196 | non-transfer surface |
| 200 | multichannel laser printhead |
| 202 | micropositioning device |
| 204 | carriage |

What is claimed is:

1. A method of depositing organic layers onto a substrate in the making of an OLED device, comprising the steps of:
   (a) providing a donor element having transferable organic material in transfer relationship with an OLED substrate;
   (b) forming a substantially uniform linear laser light beam;
   (c) providing a spatial light modulator responsive to the linear laser light beam and adapted to form multichannel linear laser light beams;
   (d) individually modulating selected channels to form one or more laser light beam segments wherein each segment can include one or more laser light beam channels and further wherein the lased light beam segment(s) have substantially square intensity profiles in a first direction and a substantially Gaussian intensity profile in a second direction perpendicular to the first direction and are directed onto the donor element; and
   (e) the donor element producing heat in responsive to the light from the modulated segments so as to heat transfer organic material onto selected areas of the substrate.

2. The method of claim 1 wherein the laser light beam is provided by a single laser or a plurality of multi-mode emitters.

3. The method of claim 2 wherein the uniform linear laser light beam is formed by optically combining the laser light provided by the plurality of multi-mode emitters to provide the substantially uniform linear laser light beam.

4. The method of claim 1 wherein the laser light modulator is a total internal reflection modulator.

5. The method of claim 1 further including securing the donor element relative to the substrate and providing relative movement in a direction substantially perpendicular to the multichannel linear laser light beam between the multichannel linear laser light beam and the secured substrate/donor element to deposit organic material along a predetermined first linear path.

6. The method of claim 5 wherein the secured substrate/donor element are stationary while the multichannel laser light beam is moved.

7. The method of claim 5 wherein after a plurality of predetermined first positions on the substrate have received deposited organic material the relative position between the multichannel linear laser light beam and the secured substrate/donor element is changed to a second position so that deposited organic material in a predetermined second linear path spaced from the first predetermined linear path to permit the deposition of organic material in predetermined second positions on the substrate that were not previously deposited.

8. The method of claim 1 wherein the OLED deposition is under reduced pressure or at atmospheric pressure.

9. A method of depositing organic layers onto a substrate in the making of a color OLED device, comprising the steps of:
 (a) providing a plurality of donor elements each having a different organic material and positioning the donor elements in sequential relationship with an OLED substrate;
 (b) forming a substantially uniform linear laser light beam;
 (c) providing a spatial light modulator responsive to the linear laser light beam and adapted to form multichannel linear laser light beams;
 (d) individually modulating selected channels to form one or more laser light beam segments wherein each segment can include one or more laser light beam channels and further wherein the laser light beam segment(s) have substantially square intensity profiles in a first direction and a substantially Gaussian intensity profile in a second direction perpendicular to the first direction and are directed onto the donor element;
 (e) the donor element producing heat in response to the light from the modulated segments so as to heat transfer organic material onto selected areas of the substrate; and
 (f) repeating steps (d) and (e) for the different donor elements to thereby form organic layers on the substrate which correspond to different color pixels.

10. The method of claim 9 wherein the laser light beam is provided by a single laser or a plurality of multi-mode emitters.

11. The method of claim 10 further including the step of optically combining the laser light provided by the plurality of multi-mode emitters to provide the substantially uniform linear laser light beam.

12. The method of claim 9 wherein the spatial light modulator is a total internal reflection modulator.

13. The method of claim 9 further including securing the donor element relative to the substrate and providing relative movement in a direction substantially perpendicular to the multichannel laser light beam between the multichannel linear laser light beam and the secured substrate/donor element to deposit organic material along a predetermined first linear path.

14. The method of claim 13 wherein the secured substrate/donor element are stationary while the multichannel laser light beam is moved.

15. The method of claim 13 wherein after a plurality of predetermined first positions on the substrate have received deposited organic material the relative position between the multichannel linear laser light beam and the secured substrate/donor element is changed to a second position so that deposited organic material in a predetermined second linear path spaced from the first predetermined linear path to permit the deposition of organic material in predetermined second positions on the substrate that were not previously deposited.

16. The method of claim 9 wherein the OLED deposition is under reduced pressure or at atmospheric pressure.

17. A laser printer for depositing organic layers onto a substrate in the making of an OLED device, comprising:
 (a) a donor element having transferable organic material in transfer relationship with an OLED substrate;
 (b) means for forming a substantially uniform linear laser light beam;
 (c) a spatial light modulator responsive to the linear laser light beam and adapted to form multichannel linear laser light beams;
 (d) means for individually modulating selected channels to form one or more laser light beam segments wherein each segment can include one or more laser light beam channels and further wherein the laser light beam segment(s) have substantially square intensity profiles in a first direction and a substantially Gaussian intensity profile in a second direction perpendicular to the first direction and are directed onto the donor element; and
 (e) the donor element producing heat in response to the light from the modulated segments so as to heat transfer organic material onto selected areas of the substrate.

18. The apparatus of claim 17 wherein the laser light beam is provided by a single laser or a plurality of multi-mode emitters.

19. The apparatus of claim 18 wherein the means for providing the uniform laser light beam includes a source for producing a laser light beam and means for optically combining the laser light provided by the plurality of multi-mode emitters to provide the substantially uniform linear laser light beam.

20. The apparatus of claim 17 wherein the spatial light modulator is a total internal reflection modulator.

21. The apparatus of claim 17 further including means for securing the donor element relative to the substrate and providing relative movement in a direction substantially perpendicular to the multichannel linear laser light beam between the multichannel linear laser light beam and the secured substrate/donor element to deposit organic material along a predetermined first linear path.

22. The apparatus of claim 21 wherein the secured substrate/donor element are stationary while the multichannel laser light beam is moved.

23. The apparatus of claim 21 further including means operable after a plurality of predetermined first positions on the substrate have received deposited organic material for changing the relative position between the multichannel linear laser light beam and the secured substrate/donor element to a second position so that deposited organic material in a predetermined second linear path spaced from the first predetermined linear path to permit the deposition of organic material in predetermined second positions on the substrate that were not previously deposited.

24. The apparatus of claim 17 wherein the OLED deposition is under reduced pressure or at atmospheric pressure.

* * * * *

UNITED STATES PATENT AND TRADEMARK OFFICE
CERTIFICATE OF CORRECTION

PATENT NO.     : 6,582,875 B1
DATED          : June 24, 2003
INVENTOR(S)    : David B. Kay et al.

It is certified that error appears in the above-identified patent and that said Letters Patent is hereby corrected as shown below:

Column 22,
Line 41, section (d), "lased" should read -- laser --.
Line 46, section (e), "responsive" should read -- response --.
Line 56, "laser" should read -- spatial --.

Signed and Sealed this

Seventh Day of October, 2003

JAMES E. ROGAN
*Director of the United States Patent and Trademark Office*